United States Patent
Yamada et al.

(10) Patent No.: US 10,128,024 B2
(45) Date of Patent: Nov. 13, 2018

(54) MGB$_2$-BASED SUPERCONDUCTING WIRE FOR A LIQUID HYDROGEN LEVEL SENSOR, A LIQUID HYDROGEN LEVEL SENSOR, AND A LIQUID HYDROGEN LEVEL GAUGE

(71) Applicant: Tokyo Wire Works, Ltd., Tokyo (JP)

(72) Inventors: Hiroyoshi Yamada, Tokyo (JP); Naoki Koshizuka, Tokyo (JP); Kazunari Mochizuki, Tokyo (JP); Satoshi Shimura, Tokyo (JP)

(73) Assignee: TOKYO WIRE WORKS, LTD., Tokyo (JP)

(*) Notice: Subject to any disclaimer, the term of this patent is extended or adjusted under 35 U.S.C. 154(b) by 396 days.

(21) Appl. No.: 14/443,234

(22) PCT Filed: Apr. 4, 2013

(86) PCT No.: PCT/JP2013/060314
§ 371 (c)(1),
(2) Date: May 15, 2015

(87) PCT Pub. No.: WO2014/076981
PCT Pub. Date: May 22, 2014

(65) Prior Publication Data
US 2015/0332811 A1 Nov. 19, 2015

(30) Foreign Application Priority Data
Nov. 15, 2012 (JP) .................................. 2012-251345

(51) Int. Cl.
*H01B 12/04* (2006.01)
*G01F 23/24* (2006.01)
(Continued)

(52) U.S. Cl.
CPC ............. *H01B 12/04* (2013.01); *C01B 35/04* (2013.01); *G01F 23/24* (2013.01); *G01F 23/247* (2013.01);
(Continued)

(58) Field of Classification Search
CPC ........ H01B 12/04; G01F 23/24; G01F 23/247
See application file for complete search history.

(56) References Cited

U.S. PATENT DOCUMENTS 5,045,527 A * 9/1991 Ikeno ..................... C04B 35/45
505/410
6,049,042 A * 4/2000 Avellanet ........... H01B 13/0292
174/128.1

(Continued)

FOREIGN PATENT DOCUMENTS

DE   10 2005 010977 A1   9/2006
EP       1 857 785 A2   11/2007
(Continued)

OTHER PUBLICATIONS

B. Birajdar et al, "Al-alloyed MgB$_2$: correlation of superconducting properties, microstructure and chemical composition", Journal of Physics: Conference Series 43 (2006), pp. 484-487.

(Continued)

*Primary Examiner* — Paul A Wartalowicz
(74) *Attorney, Agent, or Firm* — Michael Tobias

(57) ABSTRACT

An MgB$_2$-based superconducting wire for a liquid hydrogen fluid level sensor which can maintain an unimmersed portion of the MgB$_2$-based superconducting wire for a liquid hydrogen fluid level sensor in a non-superconducting state even without heating the unimmersed portion is provided. A wire for a liquid hydrogen fluid level sensor comprises an MgB$_2$-based superconductor which contains Mg, B, and Al. The critical temperature at which the electrical resistance (Continued)

becomes essentially zero is 20-25 K, and the transition width, which is the difference between the temperature at which the electrical resistance begins to decrease toward zero and the critical temperature, is at most 5 K.

11 Claims, 8 Drawing Sheets

(51) Int. Cl.
    *H01B 12/02*     (2006.01)
    *C01B 35/04*     (2006.01)
    *H01L 39/10*     (2006.01)
    *H01L 39/12*     (2006.01)
    *H01L 39/24*     (2006.01)

(52) U.S. Cl.
    CPC ........... *G01F 23/248* (2013.01); *H01B 12/02* (2013.01); *H01L 39/10* (2013.01); *H01L 39/125* (2013.01); *H01L 39/2487* (2013.01)

(56) References Cited

U.S. PATENT DOCUMENTS

| | | | |
|---|---|---|---|
| 7,841,235 B2 | 11/2010 | Haberstroh | .................. 73/295 |
| 8,173,579 B2 | 5/2012 | Nakane et al. | ............... 505/430 |
| 2004/0116301 A1* | 6/2004 | Tallon | ................ C04B 35/5805 505/100 |
| 2007/0266795 A1* | 11/2007 | Tanaka | .................. G01F 23/246 73/861.08 |

FOREIGN PATENT DOCUMENTS

| | | |
|---|---|---|
| JP | 2006-234391 A | 9/2006 |
| JP | 2007-040825 A | 2/2007 |
| JP | 2007-304074 A | 11/2007 |
| JP | 2009-175034 A | 8/2009 |
| JP | 2009-295458 A | 12/2009 |
| JP | 2011-214951 A | 10/2011 |
| WO | 2007/049623 A1 | 5/2007 |

OTHER PUBLICATIONS

H. Luo et al, "Study of Al doping effect on superconductivity of Mg$_{1-x}$Al$_x$B$_2$", Journal of Applied Physics, vol. 91, No. 10 (May 15, 2002), pp. 7122-7124.

J. Ma et al, "Al-Doping Effects on the Structural Change of MgB$_2$", J. Supercond Nov Magn (2010) 23, pp. 187-191.

J. Karpinski et al, "MgB$_2$ single crystals: high pressure growth and physical properties", Superconductor Science Technology 16 (Jan 2003), pp. 221-230.

M. Mudgel et al, "Aluminium substitution induced superstructures in Mg$_{1-x}$Al$_x$B$_2$ (x=0.0 to 0.50): An X-ray diffraction study", Physica C-Superconductivity and Its Applications 467 (Sep. 2007), pp. 31-37.

M. Putti et al, "Critical Field of Al-Doped MgB$_2$ Samples: Correlation with the Suppression of σ-Band Gap", Phys. Rev. B 71, 144505 (2005) (reprint).

* cited by examiner (a)

(b)

MGB₂-BASED SUPERCONDUCTING WIRE FOR A LIQUID HYDROGEN LEVEL SENSOR, A LIQUID HYDROGEN LEVEL SENSOR, AND A LIQUID HYDROGEN LEVEL GAUGE

TECHNICAL FIELD

This invention relates to an $MgB_2$-based superconducting wire for a liquid hydrogen level sensor, a liquid hydrogen level sensor, and a liquid hydrogen level gauge.

BACKGROUND ART

Because hydrogen fuel (hydrogen energy) does not discharge $CO_2$ at the time of an oxidation reaction, it is expected to be used in the near future as a new type of energy in place of conventional fossil fuels. Hydrogen has a low boiling point, and when it is stored at a low temperature, a thermally insulated vessel is necessary. When it is stored as a gas, a high-pressure tank is necessary. For example, the pressure of gas cylinders for hydrogen vehicles which store hydrogen as a gas is currently set at 35 MPa.

The density of liquid hydrogen at atmospheric pressure is greater than the density of compressed hydrogen gas under 35 MPa at room temperature. Therefore, liquid hydrogen has the advantage over gaseous hydrogen that it has a higher storage density. In this manner, liquid hydrogen is an effective form of utilizing hydrogen fuel.

$MgB_2$, which is a new superconductor which was discovered in Japan in 2001, has a critical temperature of 39 K. Therefore, it can exhibit superconductivity in liquid hydrogen, which has a boiling point of approximately 20 K under atmospheric pressure. Liquid hydrogen fluid level gauges which can measure the amount of liquid hydrogen remaining inside a storage vessel from the exterior thereof and which use $MgB_2$-based superconductors as liquid hydrogen fluid level sensing elements (referred to below simply as sensors) have been proposed.

Patent Document 1 discloses a fluid level sensing element for detecting the level of liquid hydrogen. It comprises an $MgB_2$ superconducting wire which is in a superconducting state at the boiling point of liquid hydrogen and a tubular metal sheath which covers the superconducting wire.

Patent Document 2 discloses a fluid level sensing element for liquefied gas in which superconducting compound layers comprising Mg and B with a molar ratio Mg:B=X:Y of 1:1.2-1.9 or 2.1-2.8 or 2:0.4-0.9 or 1.1-1.8 and at least one of C and Si are continuously disposed in the lengthwise direction of all or a portion of the surface of a wire-shaped metal conductor. At the time of measuring a fluid level, the immersed portion of the Mg/B compound is in a superconducting state.

Patent Document 3 discloses a liquid hydrogen fluid level sensing element having an elongated or coil-shaped superconductor expressed as $Mg(B_{1-x}C_x)_2$ in which a portion of the B atoms in $MgB_2$ are replaced by C atoms and a covering metal which covers the surface of the superconductor.

Non-Patent Documents 1-5 disclose that the critical temperature of a pellet made from a superconductor in which Al is added to $MgB_2$ is lowered to below 36 K.

PRIOR ART DOCUMENTS

Patent Documents

Patent Document 1: JP 2006-234391 A
Patent Document 2: JP 2007-304074 A
Patent Document 3: JP 2009-175034 A Non-Patent Documents Non-Patent Document 1: "Al-alloyed $MgB_2$: correlation of superconducting properties, microstructure and chemical composition", Journal of Physics: Conference Series 43 (2006), pages 484-487
Non-Patent Document 2: "Study of Al doping effect on superconductivity of $Mg_{1-x}Al_xB_2$", Journal of Applied Physics, Volume 91, Number 10, 15 May 2002
Non-Patent Document 3: "Al-Doping Effects on the Structural Change of $MgB_2$", J Superconductor Nov Magn (2010) 23, pages 187-191
Non-Patent Document 4: "$MgB_2$ single crystals: high pressure growth and physical properties", Superconductor Science Technology 16 (2003), pages 221-230
Non-Patent Document 5: "Aluminium substitution induced superstructures in $Mg_{1-x}Al_xB_2$ (x=0.0 to 0.50): An X-ray diffraction study", Physica C-Superconductivity and Its Applications 467 (December 2007), pages 31-37

SUMMARY OF THE INVENTION

Problem which the Invention is to Solve

The liquid hydrogen fluid level sensing elements disclosed in Patent Documents 1-3 dispose an $MgB_2$-based superconductor in the region where the level of the surface of liquid hydrogen varies. Such a sensing element measures the fluid level of liquid hydrogen utilizing the fact that the portion of the sensing element which is immersed in the liquid (referred to below as the immersed portion) becomes superconducting while the other portion which is not immersed in the liquid (referred to below as the unimmersed portion) has a constant resistance. In order to perform measurements with high accuracy, it is necessary that the portion which is in a superconducting state and the other portion accurately reflect the height of the liquid surface. Namely, it is necessary that the unimmersed portion not become superconducting.

In actuality, the unimmersed portion is unavoidably cooled by liquid hydrogen due to thermal conduction, and its temperature near the immersed portion approaches 20 K, which is the boiling point of liquid hydrogen. In the case of an $MgB_2$-based superconductor, if its temperature falls below the critical temperature of 39 K, it becomes superconducting. Therefore, the result of measurement is as if the immersed portion is located at a higher position than the actual liquid surface, and the accuracy of measurement of the fluid level greatly decreases.

For this reason, in order to measure the fluid level of hydrogen using the liquid hydrogen fluid level sensing elements disclosed in Patent Documents 1-3, it is necessary to maintain the temperature of the unimmersed portion which is close to the immersed portion at above the critical temperature of 39 K by heating the unimmersed portion with a heater, for example.

However, because the level of liquid hydrogen inside a storage vessel repeatedly rises and falls, it is not easy to constantly heat only the unimmersed portion as the fluid level fluctuates. In addition, there is the problem that the stored liquid hydrogen evaporates due to heating of the unimmersed portion.

The reports disclosed in Non-Patent Documents 1-5 are all research concerning the effect of the addition of Al on the physical properties of an $MgB_2$-based superconductor. There is no disclosure of an actual configuration for utilizing an $MgB_2$-based superconductor containing Al as a liquid hydrogen fluid level sensor, and the reports merely disclose the effect of the addition of Al on the critical temperature in bulk forms such as polycrystals or single crystals.

The object of the present invention is to make it possible to accurately measure the fluid level of liquid hydrogen by providing an $MgB_2$-based superconducting wire for a liquid hydrogen fluid level sensor having a higher measurement accuracy than in the past, a liquid hydrogen fluid level sensing element using this $MgB_2$-based superconducting wire for a liquid hydrogen fluid level sensor, and a liquid hydrogen fluid level gauge.

Means for Solving the Problem

As a result of diligent investigations with the object of solving the above-described problems, the present inventors made the following findings A-F and completed the present invention.

(A) When a fluid level sensing element made from an $MgB_2$ superconducting wire having a critical temperature of 39 K is inserted into liquid hydrogen, the temperature of the immersed portion of the sensing element which is immersed in liquid is 20 K. However, because the unimmersed portion above the liquid surface is also cooled by conduction, its temperature falls below 39 K and it becomes superconducting, rendering its electrical resistance zero.

Accordingly, it is impossible to measure the fluid level based on the generation of a voltage in a non-superconducting state. Therefore, the fluid level is generally measured by passing a current through a fluid level sensing element so as to heat the unimmersed portion to at least the superconducting transition temperature and produce a voltage.

If the critical temperature at which the resistance of an $MgB_2$ superconductor becomes zero can be lowered from the current value of 39 K so as to approach to approximately 20 K which is the boiling point of liquid hydrogen, the superconducting region of the unimmersed portion of an $MgB_2$-based superconductor at the time of measurement of the level of liquid hydrogen can be enormously shortened in length. As a result, the portion which is not superconducting can be lengthened compared to in the past, and the border between the immersed portion and the unimmersed portion can be brought closer to the liquid surface. Therefore, the height of the liquid surface can be measured with an accuracy which is adequate for practical purposes even if the unimmersed portion is not heated. In addition, even when heating is performed in order to increase accuracy, the heated region can be decreased in length, resulting in a decrease in evaporative loss of liquid hydrogen due to heating. In either case, a fluid level detection system for a liquid hydrogen fluid level gauge can be simplified compared to in the past.

(B) As disclosed in Non-Patent Documents 1-5, the critical temperature of an $MgB_2$-based superconductor can be lowered in the above-described manner by adding Al to Mg and B. According to the results of research by the present inventors, by having a molar ratio of Mg:B:Al in the range of 1:1.8-2.2:0.05-0.25, namely, by employing a composition expressed by the chemical formula $MgB_{1.8-2.2}Al_{0.05-0.25}$, it is possible to obtain a desired critical temperature which makes it possible for a liquid hydrogen fluid level sensor to easily perform measurement with high accuracy.

(C) As the temperature of an $MgB_2$-based superconductor is decreased, a difference unavoidably develops between the temperature at which the electrical resistance of the $MgB_2$-based superconductor begins to decrease and the temperature at which the electrical resistance becomes zero (this difference being referred to in this description as the transition width). Namely, it was found that normally the electrical resistance does not suddenly become zero when a certain critical temperature is reached. Rather, the transition width normally greatly varies in accordance with the type, the composition, and the shape of the superconductor. When the transition width is large, even if a superconductor is selected in accordance with the liquid of which the level is to be measured, the electrical resistance of the unimmersed portion does not immediately become the normal resistance away from the liquid surface. It was found that the amplitude of the transition width affects the measurement accuracy of a liquid hydrogen fluid level sensor comprising an $MgB_2$-based superconductor. If the transition width can be made an extremely small value such as at most 5 K, it is possible to further increase the measurement accuracy of a liquid hydrogen fluid level sensor.

(D) It was found that in order to make the transition width of an $MgB_2$-based superconductor an extremely small value of at most 5 K, it is effective to add Al to a fluid level sensor in the form of an $MgB_2$-based superconducting wire and to preferably make the wire diameter at most 1.0 mm. This is thought to be because making the diameter of an $MgB_2$-based superconducting wire to which Al is added at most 1.0 mm allows Al to distribute more uniformly inside the $MgB_2$-based superconducting wire.

(E) Forming a liquid hydrogen fluid level sensing element by twisting together a plurality of the above-stated $MgB_2$-based superconducting wires having a diameter of at most 1.0 mm makes it possible to maintain a desired measurement accuracy even when a portion of the $MgB_2$-based superconducting wires are severed.

The present invention is as follows.

(1) An $MgB_2$-based superconducting alloy for a liquid hydrogen fluid level sensor characterized by having a composition expressed by the formula $MgB_yAl_x$ and containing Mg, B and Al in a molar ratio 1:y:x=1:1.8-2.2:0.05-0.25 and by having a critical temperature at which the electrical resistance becomes zero of 20-25 K.

(2) An $MgB_2$-based superconducting wire for a liquid hydrogen fluid level sensor comprising a superconducting core and a tubular metal sheath which covers the core, characterized in that the superconducting core has a composition expressed by the formula $MgB_yAl_x$ in which Mg, B, and Al have a molar ratio of 1:y:x=1:1.8-2.2:0.05-0.25 and has a critical temperature at which the electrical resistance becomes zero of 20-25 K.

(3) An $MgB_2$-based superconducting wire for a liquid hydrogen fluid level sensor as set forth above in (2) characterized in that the difference between the temperature at which the electrical resistance begins to decrease towards the critical temperature and the critical temperature is at most 5 K.

(4) An $MgB_2$-based superconducting wire for a liquid hydrogen fluid level sensor as set forth above in (2) or (3) characterized in that the diameter of the wire is at most 1.0 mm and that when the temperature is decreasing, the critical temperature at which the electrical resistance becomes zero is 20-25 K.

(5) A liquid hydrogen fluid level sensing element characterized by comprising a plurality of $MgB_2$-based superconducting wires for a liquid hydrogen fluid level sensor as set forth above in any one of (2)-(4) which are twisted together.

(6) A liquid hydrogen fluid level sensing element characterized in that a plurality of the $MgB_2$-based superconducting wires for a liquid hydrogen fluid level sensor as set forth above in any one of (2)-(4) are twisted together and the entirety of the resulting twisted wires is resin coated.

(7) A liquid hydrogen fluid level gauge for measuring the fluid level of liquid hydrogen stored inside a thermally insulated vessel, characterized by comprising:

a liquid hydrogen fluid level sensing element as set forth above in (5) or (6) which is disposed at a height encompassing the liquid surface so as to contact the liquid hydrogen, a power supply which supplies a constant current to the liquid hydrogen fluid level sensing element, a voltmeter which measures the voltage of the liquid hydrogen fluid level sensing element, and means for determining the height of the liquid surface based on the voltage measured by the voltmeter.

(8) A method of measuring the fluid level of liquid hydrogen characterized by immersing a liquid hydrogen fluid level sensing element as set forth above in (5) or (6) into the liquid surface of liquid hydrogen stored inside a thermally insulated vessel from above the liquid surface, and determining the height of the surface of the liquid hydrogen from the bottom of the vessel based on the magnitude of $V_3+V_2$ which is obtained as the sum of the voltage $V_3$ corresponding to the distance from the tip of the fluid level sensing element to the bottom of the vessel and the immersed portion voltage $V_2$ which is measured from the voltage of the unimmersed portion of the fluid level sensing element.

Effects of the Invention

As a result of the present invention, an $MgB_2$-based superconducting wire for a liquid hydrogen fluid level sensor which can more accurately measure the fluid level without heating or the like of the unimmersed portion of an $MgB_2$-based superconducting wire for a liquid hydrogen fluid level sensor is provided, and the level of liquid hydrogen stored inside a thermally insulated vessel can be measured without heating the unimmersed portion of an $MgB_2$-based superconducting wire for a liquid hydrogen fluid level sensor or by heating it by a smaller amount than in the past.

MODE FOR CARRYING OUT THE INVENTION

Figure 1:
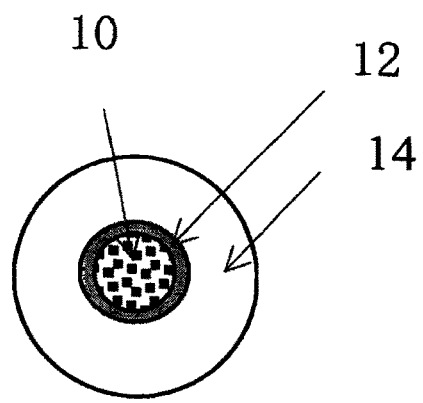
FIG. 1 is an explanatory view showing a cross section of a wire during manufacture by a first manufacturing method.

The present invention will be explained while referring to the attaching drawings.

1. $MgB_2$-Based Superconducting Wire for a Liquid Hydrogen Level Sensor

The critical temperature of an MgB-based superconducting wire for a liquid hydrogen fluid level sensor (referred to below simply as a superconducting wire) according to the present invention, namely, the temperature at which the electrical resistance becomes zero is 20-25 K. If the critical temperature falls below approximately 20 K which is the boiling point of liquid hydrogen, the wire can no longer be used for a liquid hydrogen fluid level sensor. On the other hand, if the critical temperature exceeds 25 K, the length of the unimmersed portion of the superconducting wire which does not become superconducting when measuring the fluid level of liquid hydrogen stored inside a thermally insulated vessel increases, and it becomes necessary to heat part of the unimmersed portion depending on the difference of the critical temperature from the boiling point of liquid hydrogen. Therefore, the critical temperature at which the electrical resistance of the superconducting wire becomes zero is set to be at least 20 K and at most 25 K. The reason why the upper limit on the critical temperature is set at 25 K is because the pressure inside a thermally insulated vessel which stores liquid hydrogen is 0-0.3 MPa, and the boiling point of liquid hydrogen at this pressure is at most 25 K.

A superconducting wire according to the present invention comprises a central core in which superconductivity develops and a tubular metal sheath which protects the central core. The core contains Mg, B, and Al in a molar ratio of 1: 1.8-2.2:0.05-0.25. The composition is expressed as $MgB_{1.8-2.2}Al_{0.05-0.25}$.

The material constituting the central core is a "superconducting alloy", and a "superconducting wire" is constituted of the central core, i.e., a superconducting core, and a tubular metal sheath which covers the core.

The reasons why the superconducting alloy contains Al are (i) in order to achieve a critical temperature of 20-25 K, (ii) due to the melting temperatures of Al and Mg which are extremely close to each other (Al: 660.4° C., Mg: 648.6° C.), both elements can melt and undergo a diffusion reaction in B particles at an appropriate heat treatment temperature to synthesize $MgAlB_2$ microcrystals, (iii) in view of the fact that added elements other than Al have a larger difference in melting temperature, Al has the greatest affinity for Mg, and (iv) Al can be used as a sheath material which has good ductility and is easily worked. In this context, the Al sheath material is distinguished from the above-mentioned tubular metal sheath which is made of stainless steel or similar material, for example, since the Al sheath material is consumed by subsequent heat treatment.

If the contents of Mg and B are outside of the above-described ranges, superconductivity is no longer exhibited. If the Al content is outside the above-described range, the critical temperature at which the electrical resistance becomes zero falls outside the range of 20-25 K, and as stated above, it is not possible for a wire to accurately detect the fluid level when used as a sensor wire, and it becomes necessary to heat the unimmersed portion.

The diameter of the superconducting wire is preferably at most 1.0 mm. With this diameter, Al becomes uniformly distributed inside the wire when heat treatment takes place, and the variation with position in the amount of Al present inside a transverse cross section is decreased. Therefore, the transition width, which is the difference between the temperature when the electrical resistance begins to decrease towards the critical temperature and the critical temperature, becomes an extremely small value of at most 5 K, and the performance of the superconducting wire as a liquid hydrogen fluid level sensor can be further improved.

In the below-described examples, "the temperature at which the electrical resistance begins to decrease towards the critical temperature" is determined by measuring the electrical voltage at temperature intervals of 0.1 K, and is made the temperature when the voltage decreases by at least 5 times from the value which was measured at the immediately preceding 0.1 K higher temperature. However, a different method can be used, and it can be determined from the overall resistance changes observed when the electrical resistance decreases from its normal value to zero by decreasing the temperature of the superconducting wire so as to approach to the critical temperature. In this case, it can be made the temperature when it is possible to consider that the resistance has started to decrease.

In a preferred embodiment of the present invention, the standard for the transition width is set to at most 5 K. However, as described above, the transition width affects the accuracy of fluid level measurement. Therefore, the transition width is not limited to this value, and it is possible to set a suitable transition width in accordance with the required accuracy and to use a wire and a manufacturing method suitable for the transition width which is set.

From the same standpoint, the diameter of the superconducting wire is preferably at most 1.0 mm, more preferably at most 0.8 mm, still more preferably at most 0.6 mm, and even still more preferably at most 0.4 mm. In a preferred embodiment of the present invention, by forming an $MgB_2$-based superconducting wire to which Al is added with a wire diameter of at most 1.0 mm, it is possible to limit the transition width to a low value of around 5 K, so the cross section of the wire is made small. However, the wire diameter is not limited to this value, and a wire in which Al is uniformly distributed inside the wire and variation with position in the amount of Al present in a transverse cross section is reduced so that the transition width can be suppressed to a small value can be used as a wire for a fluid level sensor according to the present invention even if its cross-sectional area is not made small.

As a result, the transition width, which is the difference between the critical temperature at which the electrical resistance of the immersed portion of a superconducting wire becomes zero and the temperature at which the resistance begins to decrease towards a superconducting state, is an extremely small value of at most 5 K. Therefore, the distance from the liquid surface corresponding to a transition width of 5 K (the portion where the electrical resistance of the unimmersed portion is small) also becomes small. If the overall length of the unimmersed portion is set to a sufficiently large value, the length of the unimmersed portion corresponding to a transition width of 5 K can be measured as a tolerance which is acceptable for practical purposes.

In addition, since the critical temperature of the unimmersed portion is 20-25 K, the length of the unimmersed portion in the region where the unimmersed portion of the superconducting wire is cooled to the boiling point of liquid hydrogen due to the cooling effect of evaporated gas can be quantitatively measured.

Therefore, according to the present invention, it becomes possible to measure the resistance of the unimmersed portion of a superconducting wire with a tolerance corresponding to a transition width of at most 5 K, and the region of the superconducting wire which is influenced by the cooling effect of vaporized gas from liquid hydrogen becomes extremely narrow. Accordingly, it is made possible to accurately measure the level of liquid hydrogen with an accuracy which is sufficient for practical purposes without heating a liquid hydrogen fluid level sensor with a heater, and a fluid level detecting system can be simplified.

When it is necessary to further increase the measurement accuracy of the fluid level, it is possible to carry out even higher accuracy measurement by heating the liquid hydrogen fluid level sensor in a region which is affected by the cooling effect of vaporized gas with a heater to a temperature of at least the transition width (at most 5K) of the critical temperature. Since the transition width is a small value of 5 K, a sufficient effect is obtained with a heater having low electric power consumption, and the amount of vaporized gas which is generated can be decreased.

A superconducting alloy according to the present invention and a superconducting core which constitutes a superconducting wire may contain, as necessary, elements in addition to Al such as C, Mn, and the like in a range which can maintain the critical temperature at which the resistance becomes zero in the range of 20-25 K. For example, when the content of C has a molar ratio of 0.10 with respect to Mg, the critical temperature is 22 K, and when the content of Mn has a molar ratio of 0.05 with respect to Mg, the critical temperature is 30 K. Even in this case, the transition width is suppressed by making the wire diameter at most a prescribed value, and the resulting wire can be used as a superconducting wire according to the present invention.

2. Liquid Hydrogen Level Sensor

A liquid hydrogen level sensor according to the present invention can be formed by twisting together a plurality of the above-described superconducting wires according to the present invention. Namely, by twisting together multiple wires, even when one of the superconducting wires in the immersed portion breaks, the measured current flows in the unbroken superconducting wires, so the resistance of the immersed portion is maintained at zero. As for the resistance of the unimmersed portion due to wire breakage, if the number of superconducting wires which are twisted together is made sufficiently large (such as 4-20 wires), the magnitude of the resistance of the broken wire with respect to the resistance of the overall length of the unimmersed portion does not create any practical problems, so it is possible to markedly increase the reliability and life span of a liquid hydrogen fluid level sensor.

A plurality of superconducting wires which have been twisted together as described above can be given an insulating coating with a known formal resin or the like which has been successfully used for forming insulating coatings of superconducting wires.

The specific effect of twisting together a plurality of wires is as follows. It will be assumed that the length of a liquid hydrogen fluid level sensor is L, the cross-sectional area of the liquid hydrogen fluid level sensor is A, the cross-sectional area of superconducting wires which constitute the liquid hydrogen fluid level sensor is a, and the volume resistivity thereof is $\rho$. When, for example, nineteen superconducting wires are twisted together, the cross-sectional area A of the liquid hydrogen fluid level sensor becomes 19a. Therefore, the resistance of this liquid hydrogen fluid level sensor is $\rho \cdot L/19a$, and the resistance of the liquid hydrogen fluid level sensor when one superconducting wire breaks becomes R $\rho \cdot L/18a$. The ratio of the resistance after breakage of one of the superconducting wires which are twisted together to the resistance before wire breakage is an extremely small value of $(\rho \cdot L/18a)/(\rho \cdot L/19a)=1.056$. Accordingly, the sensor has excellent reliability.

3. Method of Manufacturing a Superconducting Wire

A superconducting wire according to the present invention can be manufactured by various methods, and the manufacturing method is not limited to a specific one. However, the following first through third manufacturing methods will be given as examples.

Figure 2:
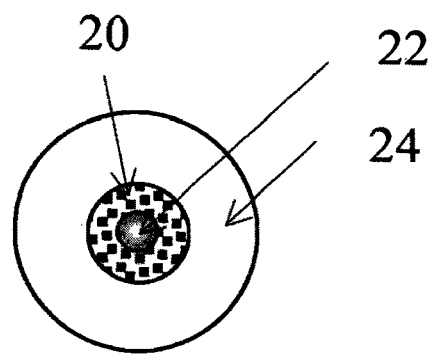
FIG. 2 is an explanatory view schematically showing a cross section of a wire during manufacture by a second manufacturing method.
Figure 3:
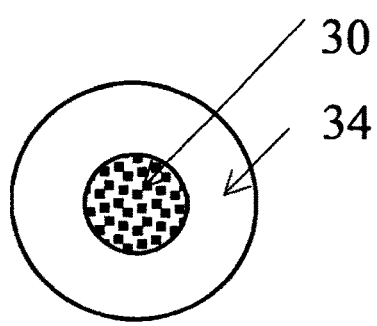
FIG. 3 is an explanatory view showing a cross section of a wire during manufacture by a third manufacturing method.

FIGS. 1-3 are explanatory views schematically showing a transverse cross section of a material being processed by wire drawing in the first through third manufacturing methods, respectively.

First Manufacturing Method

Mg and B are blended and formed into a pellet. The pellet is disposed inside an Al pipe, namely, an Al sheath material, which is then subjected to swaging The swaged Al pipe is disposed inside a tubular metal sheath in the form of a pipe made of stainless steel (SUS316L), and swaging followed by wire drawing are performed on the pipe. Thereafter, twisting and heat treatment are carried out.

Specifically, 6.89 g of Mg powder and 5.56 g of B powder (Mg:B as a molar ratio=1.1:2) are blended and formed into a pellet. Taking into consideration the weight loss of Mg due to oxidation, the molar ratio of Mg with respect to B is preferably increased by 10 percent. The pellet has a diameter of 8.5 mm.

As shown in FIG. 1, this pellet 10 is disposed inside an Al pipe 12 having an outer diameter of 10 mm and a wall thickness of 0.6 mm, and the Al pipe is swaged and then sealed inside an SUS316L stainless steel pipe 14 having an outer diameter of 6.0 mm and a wall thickness of 1.5 mm. The pipe 14 is then swaged to obtain an outer diameter of 2.0 mm.

The dimensions and weight of the Al pipe are set so that it is melted and entirely diffused into the Mg and B powder pellet to obtain the desired $MgB_y Al_x$ superconductor during the final heat treatment.

Next, the pipe 14 is subjected to a first wire drawing step using an alloy die in a wire drawing machine to obtain an outer diameter of 1.0 mm and then to a second wire drawing step to obtain a fine wire with an outer diameter of 0.1 mm.

Four fine wires which are obtained in this manner are formed into a twisted wire using a wire twisting machine, and then the twisted wire undergo heat treatment to complete sintering of an Al-containing $MgB_2$-based superconducting wire. According to this manufacturing method, in each of the fine wires constituting the four-strand twisted wire, Al is not blended as a powder but is added as an Al pipe having a uniform structure. Therefore, it is easy to achieve a state in which Al is uniformly dispersed from the outer side towards the center. In this manner, the first manufacturing method manufactures a superconducting wire comprising a superconducting core and a tubular metal sheath which protects it.

Second Manufacturing Method

Mg and B are blended and formed into a pellet, the pellet is pierced to form a hole, an Al wire is inserted into the hole, the pellet is disposed inside a stainless steel (SUS316L) pipe, the pipe is swaged and then wire drawing is carried out, and then wire twisting and heat treatment are performed.

Specifically, 6.89 g of Mg powder and 5.56 g of B powder (Mg:B as a molar ratio=1.1:2) are blended and formed into a pellet. Taking into consideration the weight loss of Mg due to oxidation, the molar ratio of Mg with respect to B is preferably increased by 10 percent. The pellet is given a diameter of 2.8 mm.

Next, as shown in FIG. 2, the pellet 20 is pierced to form a hole which passes through the pellet in its axial direction at the center thereof, and an Al wire 22 having a diameter of 0.89 mm is inserted into the hole formed by piercing.

This pellet is disposed inside a pipe 24 made of SUS316L having an outer diameter of 6.0 mm and a wall thickness of 1.5 mm, and the pipe is swaged to obtain an outer diameter of 2.0 mm.

Then, in the same manner as in the first manufacturing method, a first wire drawing step is carried out with an alloy die in a wire drawing machine to obtain an outer diameter of 1.0 mm, and then a second wire drawing step is carried out to form a fine wire with an outer diameter of 0.1 mm. Four of these fine wires are twisted together using a wire twisting machine, and then heat treatment is carried out to complete sintering of an Al-containing MgB-based superconductor. According to this manufacturing method, in each of the fine wires which constitute the four-strand wire, Al is not blended as a powder but is added as a wire at the center of a pellet. Therefore, it is easy to achieve a state in which Al is uniformly dispersed from the inside towards the outside. In this manner, the second manufacturing method manufactures a superconducting wire constituted by a superconducting core and a tubular metal sheath which protects it.

Third Manufacturing Method

Mg, B, and Al are blended and formed into a pellet, the pellet is disposed inside a stainless steel pipe, which is then swaged and subjected to wire drawing, and then wire twisting and heat treatment are carried out.

Specifically, 1.33 g of Mg power, 1.08 g of B powder, and 0.34 g of Al powder (Mg:B:Al as a molar ratio=1.0:1.82:0.075) are blended and formed into a pellet. Taking into consideration the weight loss of Mg due to oxidation, the molar ratio of Mg with respect to B is preferably increased by 10 percent. The diameter of the pellet is made 2.8 mm.

As shown in FIG. 3, this Al-added pellet 30 is disposed inside a pipe 34 which is made of stainless steel (SUS316L) and which has an outer diameter of 6.0 mm and a wall thickness of 1.5 mm. The pipe is then swaged to obtain an outer diameter of 2.0 mm.

Then, in the same manner as in the first manufacturing method and the second manufacturing method, a first wire drawing step is carried out in a wire drawing machine using an alloy die to obtain an outer diameter of 1.0 mm, and then a second wire drawing step is carried out to obtain a fine wire with an outer diameter of 0.1 mm. Four of these fine wires are twisted together using a wire twisting machine, and heat treatment is then carried out to complete sintering of an Al-containing $MgB_2$-based superconductor. With this manufacturing method as well, if the wire itself is sufficiently small in diameter, a state is obtained in each of the fine wires constituting the four-strand wire in which Al is uniformly dispersed from the outer side towards the center. In this manner, the third manufacturing method manufactures a superconducting wire which is constituted by a superconducting core and a tubular metal sheath which protects it.

4. Liquid Hydrogen Level Gauge

A liquid hydrogen (fluid) level gauge comprises a liquid hydrogen (fluid) level sensor constituted by the above-described superconducting wire according to the present invention, a power supply, and a voltmeter (potentiometer). The gauge measures the level of liquid hydrogen stored at atmospheric pressure inside a thermally insulated vessel.

As described above, a liquid hydrogen level sensor is formed by twisting together a plurality of $MgB_2$-based superconducting wires for a liquid hydrogen level sensor according to the present invention. The sensor is disposed over a length and at a position which encompasses the range of rise and fall of the fluid level of liquid hydrogen.

The power supply supplies a constant current to the liquid hydrogen fluid level sensor. A known device can be used as the power supply of this type. The voltmeter (potentiometer) measures the voltage (potential difference) of the liquid hydrogen level sensor. A known device can be used as the voltmeter of this type.

When using such a liquid hydrogen level sensor, as the fluid level of liquid hydrogen rises and falls, the length of the portion of the superconducting wire which is in a superconducting state varies, and at the same time, the value of the voltage which is measured by the voltmeter varies. In accordance with the changing measured value of the voltage, the length of the portion of the superconducting wire which is in a superconducting state, namely, the height of the vicinity of the surface of the liquid hydrogen is found.

The critical temperature of a superconducting wire alloy which is used in a liquid hydrogen level gauge in this mode is less than 39 K, and specifically it is a low level of 20-25 K as stated above. Therefore, even if there is almost no heating of the unimmersed portion of the fluid level sensing element which is constituted by a superconducting wire at the time of measurement of the level of liquid hydrogen, the portion of the unimmersed portion above the liquid surface which enters a superconducting state can be made small.

In this manner, according to the present invention, it becomes possible to accurately measure the level of liquid hydrogen stored inside a thermally insulated vessel. In addition, it is possible to obtain a fluid level gauge having a higher accuracy in the same manner as in the present invention by applying the principles of the present invention to a fluid level gauge for various liquids having different boiling points.

EXAMPLES

An $MgB_2$-based superconducting wire for a liquid hydrogen level sensor according to the present invention was manufactured under the conditions explained below, and its critical temperature and transition width were measured.

Here, the critical temperature is the temperature at which the electrical resistance becomes zero. The "temperature when the electrical resistance begins to decrease towards the critical temperature" was determined by measuring the voltage at temperature intervals of 0.1 K and was made the temperature when the voltage decreased by at least 5 times the value compared to the value measured when the temperature was 0.1 K higher.

The results of measurement are shown in Tables 1-3. FIGS. 4-8 show graphs which plot a portion of the measured results.

Table 1 shows the temperature, the temperature at the start of a decrease in the electrical resistance towards a superconducting state, and the difference between the two, which is the transition width, for samples of a single-strand $MgB_2$-based superconducting wire for a liquid hydrogen fluid level sensor which had a wire diameter of 0.1 mm and six different molar ratios of the Al content with respect to the Mg content, i.e., 0.00, 0.05, 0.10, 0.15, 0.25, and 0.30.

Table 2 shows the critical temperature, the temperature at the time of the start of a decrease in the electrical resistance towards a superconducting state, and the difference between the two, which is the transition width, for samples of a four-strand $MgB_2$-based superconducting wire for a liquid hydrogen fluid level sensor having a wire diameter of 0.1 mm for each strand and 5 different molar ratios of the Al content with respect to the Mg content, i.e., 0.05, 0.10, 0.15, 0.25, and 0.30.

Table 3 shows the critical temperature, the temperature at the time of the start of a decrease in the electrical resistance towards the superconducting state, and the difference between the two, which is the transition width, for samples of a single-strand $MgB_2Al_{0.20}$ superconducting wire for a liquid hydrogen fluid level sensor having a molar ratio of the Al content with respect to the Mg content of 0.20 and six different wire diameters.

TABLE 1

Superconducting properties of single-strand superconducting wires having a wire diameter of 0.10 mm and various Al contents

| Sample No. | Al content of $MgB_2Al_x$ (value of x) | Wire diameter (mm) | Critical temperature A (K) | Temperature B when electrical resistance begins to decrease (K) | Transition width B − A (K) |
|---|---|---|---|---|---|
| 1 | 0.00 | 0.10 | 27.3 | 29.2 | 1.9 |
| 2 | 0.05 | 0.10 | 26.0 | 28.3 | 2.3 |
| 3 | 0.10 | 0.10 | 24.0 | 26.7 | 2.7 |
| 4 | 0.15 | 0.10 | 21.4 | 25.9 | 4.5 |
| 5 | 0.25 | 0.10 | 20.1 | 24.2 | 4.1 |
| 6 | 0.30 | 0.10 | 16.4 | 22.5 | 6.1 |

TABLE 2

Superconducting properties of four-strand superconducting twisted wires having a strand diameter of 0.10 mm and various Al contents

| 4/0.1 twisted wires Al content of $MgB_2Al_x$ Al content | Critical temperature A (K) Temperature (K) | Temperature B when electrical resistance begins to decrease (K) (K) | Transition width B − A (K) B − A |
|---|---|---|---|
| x = 0.05 | 26.0 | 28.3 | 2.3 |
| x = 0.10 | 24.0 | 26.7 | 2.7 |
| x = 0.15 | 21 | 25.6 | 4.6 |
| x = 0.25 | 20.2 | 24.3 | 4.1 |
| x = 0.30 | 14.9 | 21.4 | 6.5 |

TABLE 3

Superconducting properties of single-strand superconducting wires having the composition $MgB_2Al_{0.2}$ and various wire diameters

| Sample No. | Wire diameter (mm) | Critical temperature A (K) | Temperature B when electrical resistance begins to decrease (K) | Transition width B − A (K) |
|---|---|---|---|---|
| 1 | 0.08 | 20.1 | 23.0 | 2.9 |
| 2 | 0.10 | 20.4 | 24.8 | 4.4 |
| 3 | 0.20 | 22.9 | 27.1 | 4.2 |
| 4 | 0.40 | 23.7 | 27.7 | 4.0 |
| 5 | 0.80 | 23.9 | 27.9 | 4.0 |
| 6 | 1.0 | 23.0 | 26.3 | 3.3 |

As shown in Table 1, when the wire diameter was 0.10 mm and the molar ratio of the Al content with respect to the Mg content was 0.05-0.25, the critical temperature was generally 20-25 K, and the transition width was at most 5 K.

As shown in Table 2, for four-strand wires having a strand diameter of 0.10 mm, when the molar ratio of the Al content with respect to the Mg content was 0.05-0.25, the critical temperature was generally 20-25 K, and the transition width was at most 5 K.

As shown in Table 3, when the wire diameter was at most 1.0 mm, in each case, the critical temperature was 20-25 K and the transition width was at most 5 K.

Figure 4:
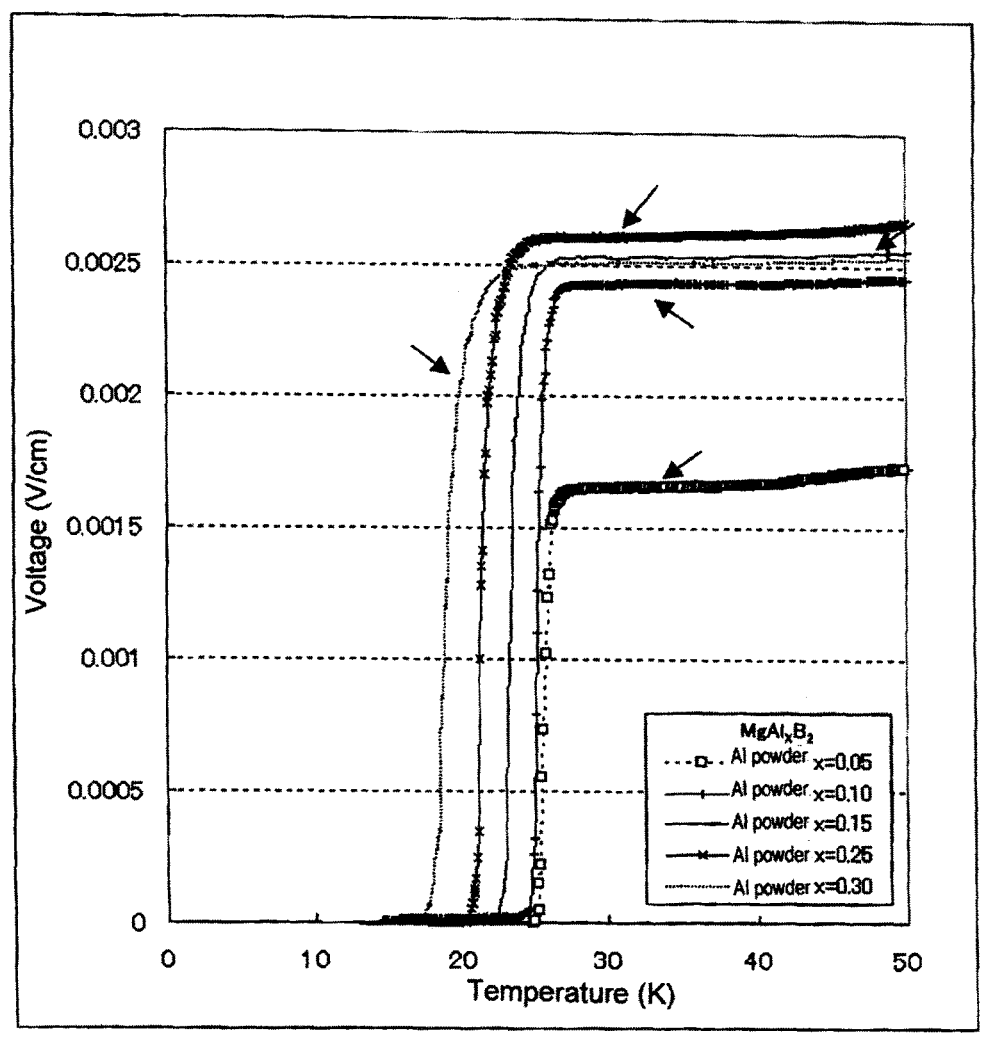
FIG. 4 is a graph showing temperature-voltage curves for samples of single-strand $MgB_2$-based superconducting wires for a liquid hydrogen fluid level sensor having a diameter of 0.1 mm and five different molar ratios of the Al content with respect to the Mg content, i.e., 0.05, 0.10, 0.15, 0.25, and 0.30.

FIG. 4 is a graph showing temperature-voltage curves for samples of single-strand $MgB_2$-based superconducting wires for a liquid hydrogen fluid level sensor having a wire diameter of 0.1 mm and five molar ratios (x) of the Al content with respect to the Mg content of 0.05, 0.10, 0.15, 0.25, and 0.30. An SUS316L stainless steel pipe was used as a tubular metal sheath. The same applied in the following examples.

As shown in FIG. 4, in the examples of the present invention, when the molar ratio (x) of the Al content with respect to the Mg content was 0.05-0.25, the critical temperature was generally 20-25 K and the transition width was at most 5 K.

Figure 5:
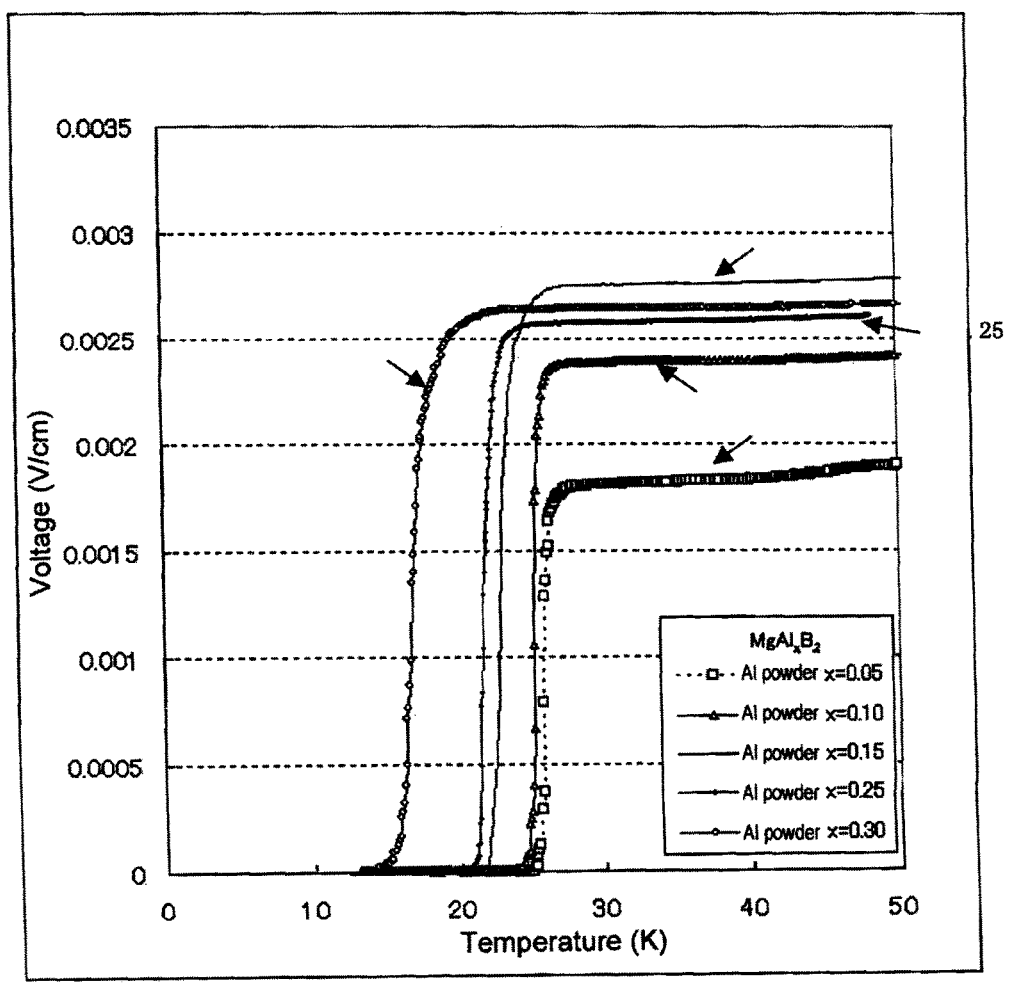
FIG. 5 is a graph showing temperature-voltage curves for samples of four-strand twisted $MgB_2$-based superconducting wires for a liquid hydrogen fluid level sensor having a diameter of 0.1 mm and five different molar ratios of the Al content with respect to the Mg content, i.e., 0.05, 0.10, 0.15, 0.25, and 0.30.

FIG. 5 is a graph showing temperature-voltage curves for samples of four-strand $MgB_2$-based superconducting wires for a liquid hydrogen fluid level sensor having a wire diameter of 0.1 mm for each strand and 5 different molar ratios (x) of the Al content with respect to Mg content of 0.05, 0.10, 0.15, 0.25, and 0.30.

As shown in the graph of FIG. 5, in the examples of the present invention, when the molar ratio of the Al content with respect to the Mg content was 0.05-0.25, the critical temperature was generally 20-25 K and the transition width was at most 5 K.

Figure 6:
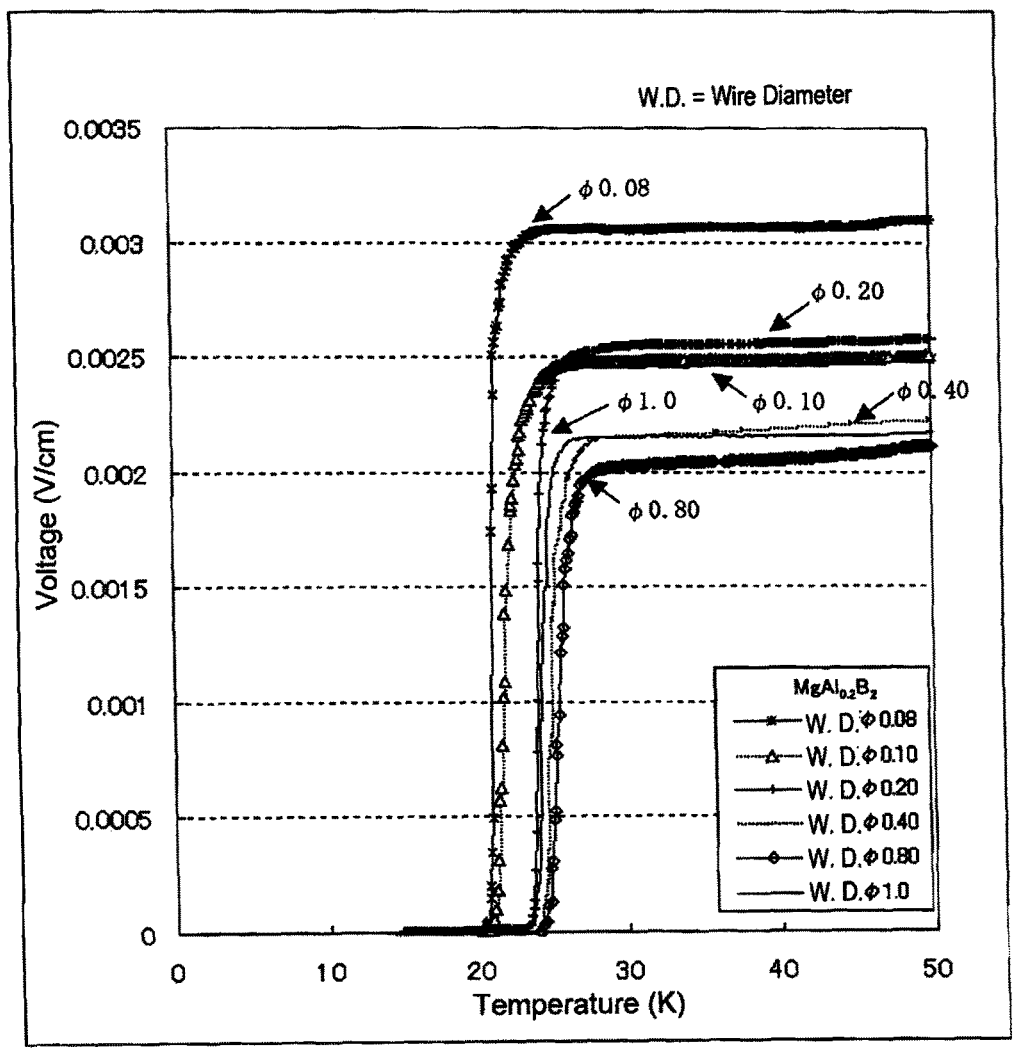
FIG. 6 is a graph showing temperature-voltage curves for samples of single-strand $MgB_2$-based superconducting wires for a liquid hydrogen fluid level sensor having six different wire diameters, i.e., 0.08, 0.10, 0.20, 0.40, 0.80, and 1.0 mm when the molar ratio of the Al content to the Mg content was 0.20.

FIG. 6 is a graph showing temperature-voltage curves for samples of single-strand $MgB_2$-based superconducting wires for a liquid hydrogen fluid level sensor having a molar ratio (x) of the Al content with respect to the Mg content of 0.20 and six different wire diameters, i.e., 0.08, 0.10, 0.20, 0.40, 0.80, and 1.0 mm.

As shown in the graph of FIG. 6, the critical temperature was 20-25 K and the transition width was at most 5 K for all of the examples of the present invention.

Figure 7:
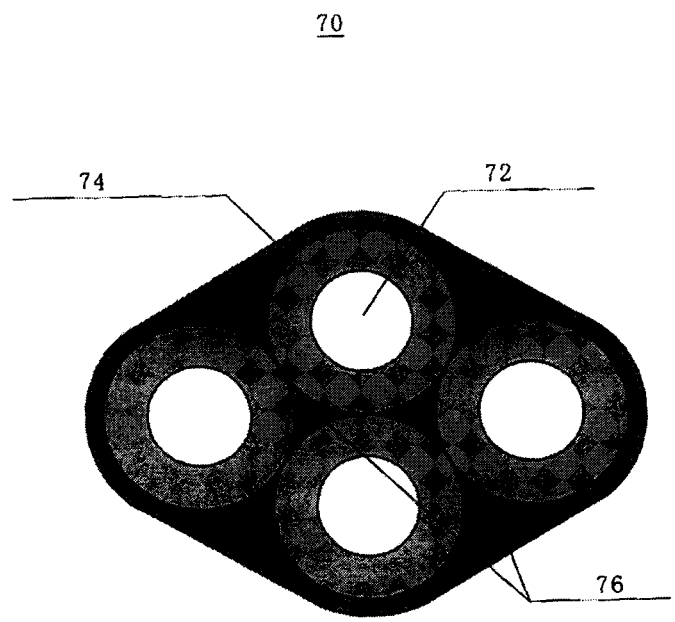
FIG. 7 is an explanatory schematic cross-sectional view of a liquid hydrogen fluid level sensing element made from a resin-coated four-strand wire.

As shown in FIG. 7, an $MgB_2$-based superconducting wire for a liquid hydrogen fluid level sensor according to the present invention comprises a superconducting core 72 and a tubular metal sheath in the form of an SUS316L pipe 74 which covers the core. A plurality of these wires may be formed into a multi-strand structure, which may be covered by a suitable resin 76. FIG. 7 schematically shows the cross-sectional structure of an $MgB_2$-based superconducting wire 7 in which four wires are twisted together and then coated with a resin to form a sensor.

In the manufacture of such a sensor, a liquid hydrogen fluid level sensor formed by twisting together a plurality of $MgB_2$-based superconducting wires is continuously coated with a coating composition for baking finish and then baked to manufacture a liquid hydrogen fluid level sensing element having a composite structure with a resin in which the twisted superconducting wires are integrally molded with a resin (such as a formal resin) to provide electrical insulation.

The effect when using a fluid level sensor having a composite structure formed by integral molding of superconducting twisted wires with a resin as in this example can be summarized as follows.

1. Breakage of extremely fine twisted wires can be prevented.

2. The twisted wire structure becomes stable, and the linearity of a fluid level sensing element is improved.

3. The surface of the stainless steel tubular sheath is integrally molded in a resin, so hydrogen embrittlement of the stainless steel tubular sheath can be prevented, and it becomes possible to stably use the fluid level sensing element over long periods.

4. Because electrically insulating integral molding is carried out with a resin, current terminals and voltage terminals for measurement can be maintained in the air while the liquid hydrogen fluid level sensing element is bent. As a result, connection of leads can be simplified.

The specifications of baked twisted wires in this example are as shown below in Table 4.

TABLE 4

Specifications of baked twisted wires

| No. | Category | Specifications |
|---|---|---|
| 1 | Structure of twisted wire | 4/0.1 |
| 2 | finished outer diameter (height × width) | 0.22 mm × 0.30 mm |
| 3 | minimum coating thickness | 0.09 mm |
| 4 | pin holes | 0 per meter |
| 5 | dielectric withstand voltage (aluminum foil method) | 1800 V |
| 6 | insulation resistance (aluminum foil method) | 4000 M · Ω |

Figure 8:
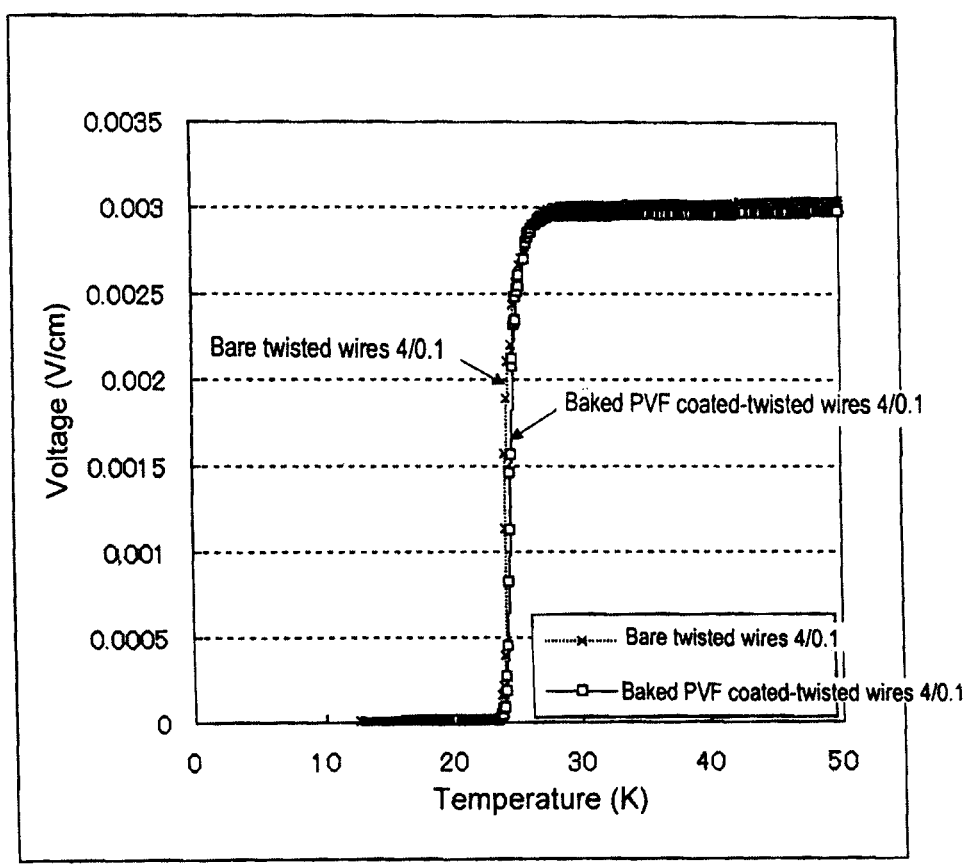
FIG. 8 is a graph showing the relationship between the temperature and voltage when using the above-described resin coated wire and when using an uncoated four-strand wire.

FIG. 8 is a graph showing the temperature-voltage relationship when using a sensing element having the above-described resin-coated twisted wire structure. The temperature-voltage relationship was obtained for a sensing element having four $MgB_2$-based superconducting wires with a wire diameter of 0.1 mm which were twisted together and resin coated and for a bare sensing element which was the same as above but not resin coated. The specific measurement method and the like were in accordance with the above-described example. It can be seen that essentially the same results as with the bare twisted wires were obtained with the resin-coated twisted wires. Namely, it can be seen that resin coating has no effect on the superconducting properties of a wire.

Figure 9:
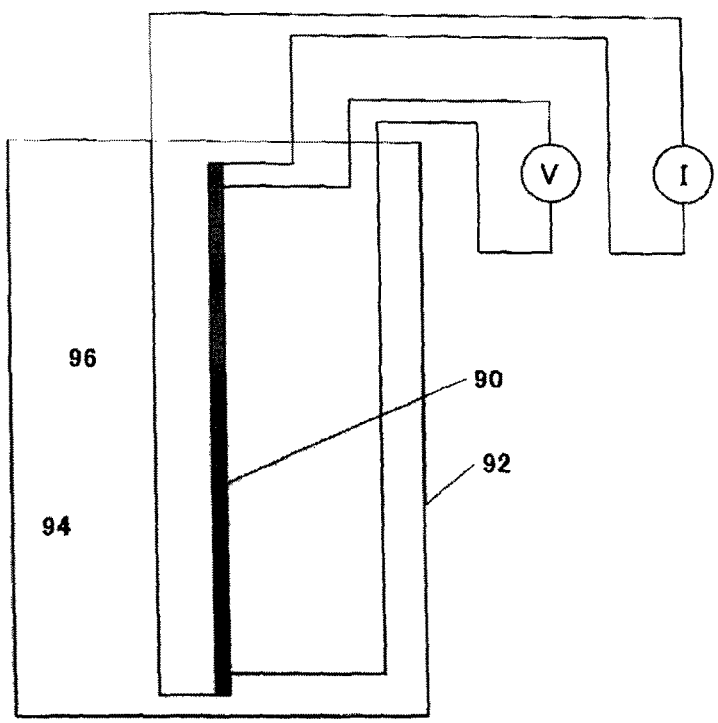
FIG. 9 is a schematic explanatory view of the structure of a liquid hydrogen fluid level gauge according to the present invention.
Figure 9:
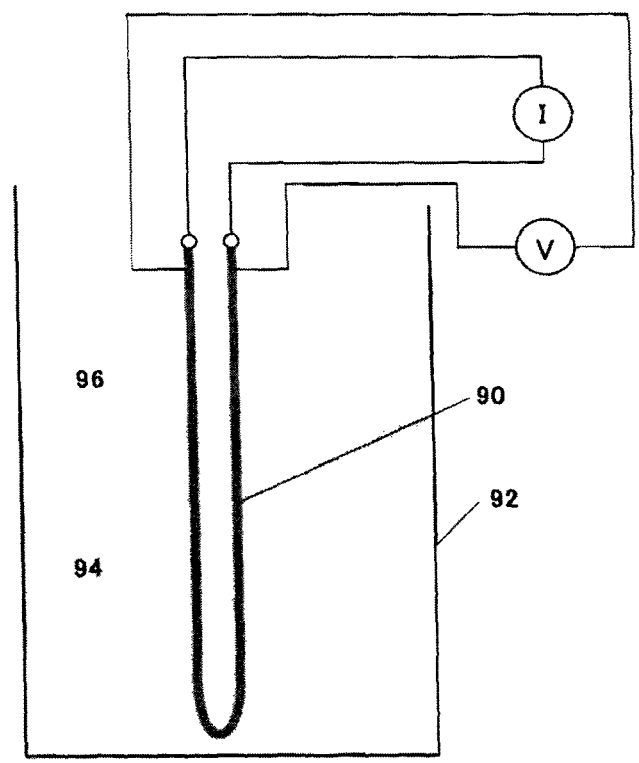

FIG. 9 is a schematic explanatory view of the structure of a fluid level gauge incorporating a fluid level sensing element according to the present invention. FIG. 9a shows a case using a straight wire, and FIG. 9b shows a case in which a fluid level sensing element is bent into the shape of a U, and the connection points to the opposite terminals of the element to connecting wires to a power supply can both be provided above the liquid surface.

In either case, the fluid level sensing element 90 is previously disposed at a prescribed position inside a liquid hydrogen vessel 92. In order to detect the liquid surface 96 of the liquid hydrogen 94, a current is passed through the fluid level sensing element 90 provided at a prescribed position at the time of measurement, the change in voltage at that time is observed, and it is determined what location (height) of the sensing element has reached the temperature of liquid hydrogen. The present invention can measure the height of the liquid surface in the range of 5 K, so the location of the liquid surface can be specified with high accuracy. It is possible to determine the height of the liquid surface within the vessel by, for example, calculating the distance of this position from the tip of the sensor.

A method of measuring the level of the liquid surface of liquid hydrogen using a liquid hydrogen fluid level sensing element according to the present invention will be explained. First, a liquid hydrogen fluid level sensing element 90 according to the present invention is immersed in liquid hydrogen 94 from the top of a vessel 92 and is disposed at a prescribed position within the vessel. As stated above, the fluid level sensing element 90 may be previously installed at the prescribed position within the vessel.

Figure 10:
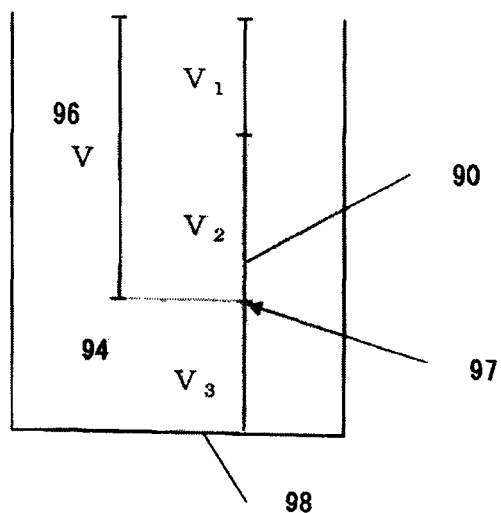
FIG. 10 is a schematic explanatory view of a method of measuring a fluid level using a fluid level sensing element according to the present invention.

As shown in FIG. 10, if the distance from the tip 97 of the fluid level sensing element to the vessel bottom 98 is previously determined, the distance from the prescribed position to the vessel bottom is given by the following equations.

Before the fluid level sensing element is cooled to the critical temperature, $V=V_1+V_2$.

When a portion of the fluid level sensing element reaches the critical temperature after the element is immersed, $V-V_1=V_2 (=0)$.

The voltage (potential difference) $V_3$ which corresponds to the distance from the tip 97 of the fluid level sensing element to the vessel bottom 98 is previously calculated, so $$V-V_1+V_3=V_2+V_3.$$

Based on the voltage $(V_2+V_3)$, the height of the liquid surface from the vessel bottom can be directly read from the measured voltage regardless of the type of vessel.

Of course, it is also possible to directly read it from the start from the distance conversion.

With either method, the distance to the liquid surface can be determined with a fluid level sensing element using either the front end or the rear end of the liquid surface sensing element as a reference.

Accordingly, by using the above-described measurement method, the height of the liquid surface from the bottom of a liquid hydrogen vessel can be easily measured regardless of the size of the liquid hydrogen vessel using a fluid level sensing element always having the same length after if necessary previously converting the distance between the end portion and the bottom of the vessel into a voltage.

The principles of fluid level measurement of a fluid level sensor using a superconductor are already known, so an explanation of a specific measurement method with the above-described fluid level sensing element will be omitted.

With either method, the distance to the liquid surface on the fluid level sensing element can be determined using either the front end or the rear end of the fluid level sensing element as a reference.

The invention claimed is:

1. A wire for a liquid hydrogen fluid level sensing element made of an $MgB_2$-based superconducting alloy having a composition expressed by the formula $MgB_yAl_x$ and containing Mg, B and Al in a molar ratio 1:y:x=1:1.8-2.2:0.05-0.25, wherein the wire has a critical temperature at which its electrical resistance becomes zero of 20-26 K, and the difference between the temperature at which the electrical resistance of the wire begins to decrease towards zero and the critical temperature is at most 5 K.

2. A wire as claimed in claim 1 wherein the molar ratio 1:y:x=1: 1.8-2.2:0.10-0.25 and the wire has a critical temperature of 20-25 K.

3. An $MgB_2$-based superconducting wire for a liquid hydrogen fluid level sensing element comprising a superconducting core and a tubular metal sheath which covers the core, wherein the superconducting core has a composition expressed by the formula $MgB_yAl_x$ in which Mg, B, and Al have a molar ratio of 1:y:x=1:1.8-2.2:0.05-0.25, the core has a critical temperature at which its electrical resistance becomes zero of 20-26 K, and the difference between the temperature at which the electrical resistance of the core begins to decrease towards zero and the critical temperature is at most 5 K.

4. A liquid hydrogen fluid level sensing element comprising a plurality of $MgB_2$-based superconducting wires as claimed in claim 3 which are twisted together.

5. A liquid hydrogen fluid level gauge for measuring the fluid level of liquid hydrogen stored inside a thermally insulated vessel comprising:
    a liquid hydrogen fluid level sensing element as claimed in claim 4 which is partially immersed in the liquid hydrogen in the vessel;
    a power supply which supplies a constant current to the sensing element; and
    a voltmeter which measures the voltage of the sensing element,
    wherein the gauge determines the height of the surface of the liquid hydrogen in the vessel based on the voltage measured by the voltmeter.

6. A liquid hydrogen fluid level gauge as claimed in claim 5 wherein the sensing element has an unimmersed portion which is disposed above the surface of the liquid hydrogen in the vessel and which is unheated.

7. A method of measuring the fluid level of liquid hydrogen comprising partially immersing a liquid hydrogen fluid level sensing element as claimed in claim 4 into liquid hydrogen stored inside a thermally insulated vessel such that the sensing element has an unimmersed portion disposed above the surface of the liquid hydrogen and an immersed portion disposed inside the liquid hydrogen, and determining the height of the surface of the liquid hydrogen from the bottom of the vessel based on the magnitude of $V+V_3-V_1$, wherein $V_3$ is a voltage corresponding to the distance from the tip of the sensing element to the bottom of the vessel, V is a voltage corresponding to an overall length of the sensing element, and $V_1$ is a voltage corresponding to a length of the unimmersed portion of the sensing element.

8. A method as claimed in claim 7 wherein the unimmersed portion of the sensing element is unheated.

9. A liquid hydrogen fluid level sensing element as claimed in claim 4 further comprising a resin coating which coats the entirety of the twisted wires.

10. An $MgB_2$-based superconducting wire as claimed in claim 3 which has a diameter of at least 0.08 mm and at most 1.0 mm.

11. An $MgB_2$-based superconducting wire as claimed in claim 3 wherein the molar ratio 1:y:x=1: 1.8-2.2:0.10-0.25 and the wire has a critical temperature of 20-25 K.

* * * * *